United States Patent
Eleyan et al.

(10) Patent No.: US 6,762,961 B2
(45) Date of Patent: Jul. 13, 2004

(54) VARIABLE DELAY COMPENSATION FOR DATA-DEPENDENT MISMATCH IN CHARACTERISTIC OF OPPOSING DEVICES OF A SENSE AMPLIFIER

(75) Inventors: Nadeem N. Eleyan, Austin, TX (US); Howard L. Levy, Cedar Park, TX (US); Jeffrey Y. Su, Cedar Park, TX (US)

(73) Assignee: Sun Microsystems, Inc., Sunnyvale, CA (US)

( * ) Notice: Subject to any disclaimer, the term of this patent is extended or adjusted under 35 U.S.C. 154(b) by 156 days.

(21) Appl. No.: 10/123,480

(22) Filed: Apr. 16, 2002

(65) Prior Publication Data

US 2003/0198112 A1 Oct. 23, 2003

(51) Int. Cl.[7] ............................. G11C 7/00; G11C 29/00
(52) U.S. Cl. ........................ 365/194; 365/201; 365/207
(58) Field of Search ................................ 365/201, 207, 365/208, 194, 233

(56) References Cited

U.S. PATENT DOCUMENTS

| | | |
|---|---|---|
| 5,638,333 A | 6/1997 | Lee |
| 5,764,178 A | 6/1998 | Kim |
| 5,796,993 A | 8/1998 | Maguire |
| 6,005,824 A | 12/1999 | Crafts |
| 6,038,195 A | 3/2000 | Farmwald et al. |
| 6,041,419 A | 3/2000 | Huang et al. |
| 6,072,733 A | 6/2000 | Advani |
| 6,111,796 A | 8/2000 | Chang et al. |
| 6,185,712 B1 | 2/2001 | Kirihata et al. |
| 6,359,816 B1 * | 3/2002 | Nurser ....................... 365/194 |
| 6,442,644 B1 * | 8/2002 | Gustavson et al. ......... 365/194 |
| 6,470,467 B2 * | 10/2002 | Tomishima et al. ......... 365/233 |

FOREIGN PATENT DOCUMENTS

FR          2 792 760          10/2000

* cited by examiner

Primary Examiner—Trong Phan
(74) Attorney, Agent, or Firm—Zagorin, O'Brien & Graham, LLP (57) ABSTRACT

Post-manufacture variation of timing may be employed to address data-dependent degradation or creep in device characteristics affecting a differential circuit. One particular example of such data-dependent degradation or creep involves Negative Bias Temperature Instability (NBTI). In certain memory circuit configurations, NBTI can cause threshold voltage ($V_t$) of PMOS devices to increase by an amount that depends on the historical amount of voltage bias that has been applied across gate and source/drain nodes. In the case of many sense amplifier designs, a predominant value read out using the sense amp may tend to disparately affect one device (or set of devices) as compared with an opposing device (or set of devices). In other words, if the same data value is read over and over again, then one of two opposing PMOS devices of a typical sense amp will accumulate an NBTI-related $V_t$ shift, while the opposing PMOS device will accumulate little or no shift. The accumulated mismatch tends to cause an increase in the sense amp fail-point.

43 Claims, 4 Drawing Sheets

VARIABLE DELAY COMPENSATION FOR DATA-DEPENDENT MISMATCH IN CHARACTERISTIC OF OPPOSING DEVICES OF A SENSE AMPLIFIER

BACKGROUND

1. Field of the Invention

The present invention relates generally to integrated circuits and, more particularly, to dynamic adjustment of timing in an integrated circuit configuration susceptible to data-dependent creep in device characteristics.

2. Description of the Related Art

Typically, modern semiconductor memories (whether embodied in a memory integrated circuit or incorporated in a larger designs, e.g., as cache memory of a processor integrate circuit) employ differential bit lines and some sort of differential amplifier or sensing circuit in their design. Such differential amplifier and sensing circuits are commonly known as sense amplifiers (sense amps) and a wide variety of sense amp designs are known in the art, including current sensing and voltage sensing variations.

Generally, when designing memory sense amps, great care is taken to optimize timing. Typically, a signal such as a strobe or equalization signal (EQ) is used to time sense amp operation. For example, transitions in an EQ signal are often used to equalize the sense amp nodes (SA and SA_1) for a period that allows opposing bit-lines (BL and BL_1) to develop sufficient voltage differential to support sensing. Once the BL & BL_1 have developed sufficient differential, EQ is transitioned to cause the sense amp to actually sense the developed differential.

If the period defined by an EQ transition is too short, then the bit-lines may not develop sufficient differential for the sense amp to correctly sense the data being read from an addressed memory cell. On the other hand, if too much time is allowed for EQ, then access time of the memory circuit is increased and achievable operating frequency (or at least memory access bandwidth) may be reduced. Therefore, in high-speed designs, the EQ signal delay path is designed to deliver the EQ transition at just the right time to ensure that correct data is being read, while aiming to minimize shortest cycle time.

The "right time" is typically a function of variations, potentially wafer-to-wafer variations or chip-to-chip variations, in the fixed electrical characteristics of fabricated circuits. To compensate for such variations, metal options may be added to a design to allow an EQ signal delay path to be tuned to the particular requirements of an integrated circuit. For example, a focused ion bean (FIB) fix may be employed to cut the EQ metal and insert additional buffering into the EQ signal path. Unfortunately, such a fix is both costly and only ensures that the EQ signal is appropriate at the time of the FIB fix.

In some conventional memory designs, variable delay paths have been introduced to accommodate a variety of supply voltage levels. See e.g., U.S. Pat. Nos. 5,638,333 and 5,764,178, in which a variety of circuits are described for introducing a variable delay in a signal path of sense amp timing signal. Typically, such circuits have been used to appropriately adapt sense amp timing in memory circuits operable at more than one supply voltage level. In other conventional memory designs, matched delay paths have been used to track variations in operating environment of semiconductor memory circuits. For example, sense amplifier delay circuits have been used to match response of a sense amplifier delay circuit with memory array temperature and voltage supply variations that affect array timing. See e.g., U.S. Pat. No. 6,072,733.

Unfortunately, in certain very-small device technologies, data-dependent effects have begun to present themselves and circuits developed to accommodate variations in supply voltage or to tune timing paths to temperature or supply voltage variables do not adequately address these data-dependent effects. One such effect is Negative Bias Temperature Instability (NBTI). Accordingly, new techniques are desired to address NBTI and other similar or related effects.

SUMMARY

It has been discovered that post-manufacture variation of timing may be employed to address data-dependent degradation or creep in device characteristics affecting a differential circuit. One particular example of such data-dependent degradation or creep involves Negative Bias Temperature Instability (NBTI). In certain memory circuit configurations, NBTI can cause threshold voltage ($V_t$) of PMOS devices to increase by an amount that depends on the historical amount of voltage bias that has been applied across gate and source/drain nodes. In the case of many sense amplifier designs, a predominance of one value read out using the sense amp may tend to disparately affect one device (or set of devices) as compared with an opposing device (or set of devices). In other words, if the same data value is read over and over again, then one of two opposing PMOS devices of a typical sense amp will accumulate an NBTI-related $V_t$ shift, while the opposing PMOS device will accumulate little or no shift. The accumulated mismatch tends to cause an increase in the sense amp fail-point.

For data-dependent degradation or creep such as that associated with NBTI effects on opposing PMOS devices, conventional techniques that employ manufacturing or circuit qualification stage fixes do not allow compensation for characteristic mismatch developed post-manufacture. Similarly, conventional matched delay circuits are generally insensitive to data-dependent degradation or creep. In contrast, techniques, circuits and methods described herein provide variable delay compensation for data-dependent mismatch in a characteristic of opposing devices, such as NBTI-related $V_t$ shift based on disparate bias histories of opposing PMOS devices of a sense amplifier of a memory circuit.

In one embodiment in accordance with the present invention, a sensing circuit for a differential pair in a semiconductor memory includes transistors configured in opposition and a variable delay element responsive to an accumulated data-dependent mismatch in characteristics of the opposing transistors. The variable delay element at least partially compensates for the characteristic mismatch by varying latency of a sensing operation of the sensing circuit. In some variations, the compensated for data-dependent mismatch results, at least in part, from an effect that disparately affects one of the transistors as compared with the other, wherein the disparate effect is based on a skew in a history of values read out from associated memory elements. In some variations, the disparate effect is associated with negative bias temperature instability. In some variations, the transistors are PMOS devices, the characteristics are threshold voltage ($V_t$) and the disparate effect involves a monotonic increase in $V_t$ based of disparate voltage bias histories of the PMOS devices.

In another embodiment in accordance with the present invention, a method of operating a semiconductor memory includes reading from and writing to addressable locations of the semiconductor memory under control of a program executing on a processor coupled thereto and performing an in-situ test operation and, responsive to failure indication consistent with an accumulated data-dependent disparity between operating characteristics of opposing devices of a sensing circuit, increasing latency of a sensing circuit control signal to accommodate the disparity. In some variations, the method further includes (i) performing, subsequent to the latency increase, additional read from and write to addressable locations of the semiconductor memory, (ii) performing a second in-situ test operation, and (iii) reducing latency of the sensing circuit control signal in accordance with a reduction an accumulated data-dependent disparity between operating characteristics of opposing devices of a sensing circuit.

In still another embodiment in accordance with the present invention, a method of compensating for accumulated data-dependent post-manufacture creep in a characteristic of one or more devices of a sensing circuit of a semiconductor memory includes: performing an in-situ test operation that writes data to and reads data from at least selected elements of the semiconductor memory, and varying latency in a control signal path leading to the sensing circuit to achieve identity between the written and read data. The latency variation at least partially compensates for the characteristic In still another embodiment in accordance with the present invention, an integrated circuit includes a sensing circuit and a variable delay element. The sensing circuit is susceptible to an accumulated data-dependent post-manufacture creep in a characteristic of a device thereof, which affects optimal timing of the sensing circuit. The variable delay element is introducible in a timing path coupled to the sensing circuit and is responsive to an operating symptom of the characteristic creep. In some variations, the integrated circuit further includes a test circuit, wherein the variable delay element responsive to the test circuit. In some variations, the operating symptom includes a read after write failure.

In still yet another embodiment in accordance with the present invention, an integrated circuit chip compensates for disparate accumulated data-dependent post-manufacture creep in a characteristic of opposing devices of a sense amplifier at least in part by varying a latency of a sense amplifier control signal. In some variations, the opposing devices are PMOS devices and the characteristic is a threshold voltage ($V_t$) of the PMOS devices.

In still yet another embodiment in accordance with the present invention, an apparatus includes means for sensing a differential pair in a semiconductor memory and means for varying delay of a sensing operation of the sensing means. The variable delay means is responsive to an accumulated data-dependent mismatch in characteristics of opposing devices of the sensing means, wherein the variable delay means, when employed, at least partially compensates for the characteristic

BRIEF DESCRIPTION OF THE DRAWINGS

The present is invention may be better understood, and its numerous objects, features, and advantages made apparent to those skilled in the art by referencing the accompanying drawings.

The use of the same reference symbols in different drawings indicates similar or identical items.

DETAILED DESCRIPTION

The description herein focuses on an illustrative set of sense amplifier circuits and devices, namely PMOS devices thereof for which a particular source of disparate post-manufacture creep in characteristics is discussed. In particular, the description focuses on negative bias temperature instability-based (NBTI-related) $V_t$ shift based on disparate bias histories of opposing PMOS devices of a sense amplifier of a memory circuit. While the particular data-dependent effect illustrated represents an important source of disparity for which techniques of the present invention are well adapted, the invention is not necessarily limited thereto. Indeed, based on the description herein, persons of ordinary skill in the art will appreciate applications to other sources of device mismatch developed post-manufacture in differential circuits. Other effects may include channel hot carrier or tunneling-related effects that disparately affect susceptible configurations of devices.

Figure 1:
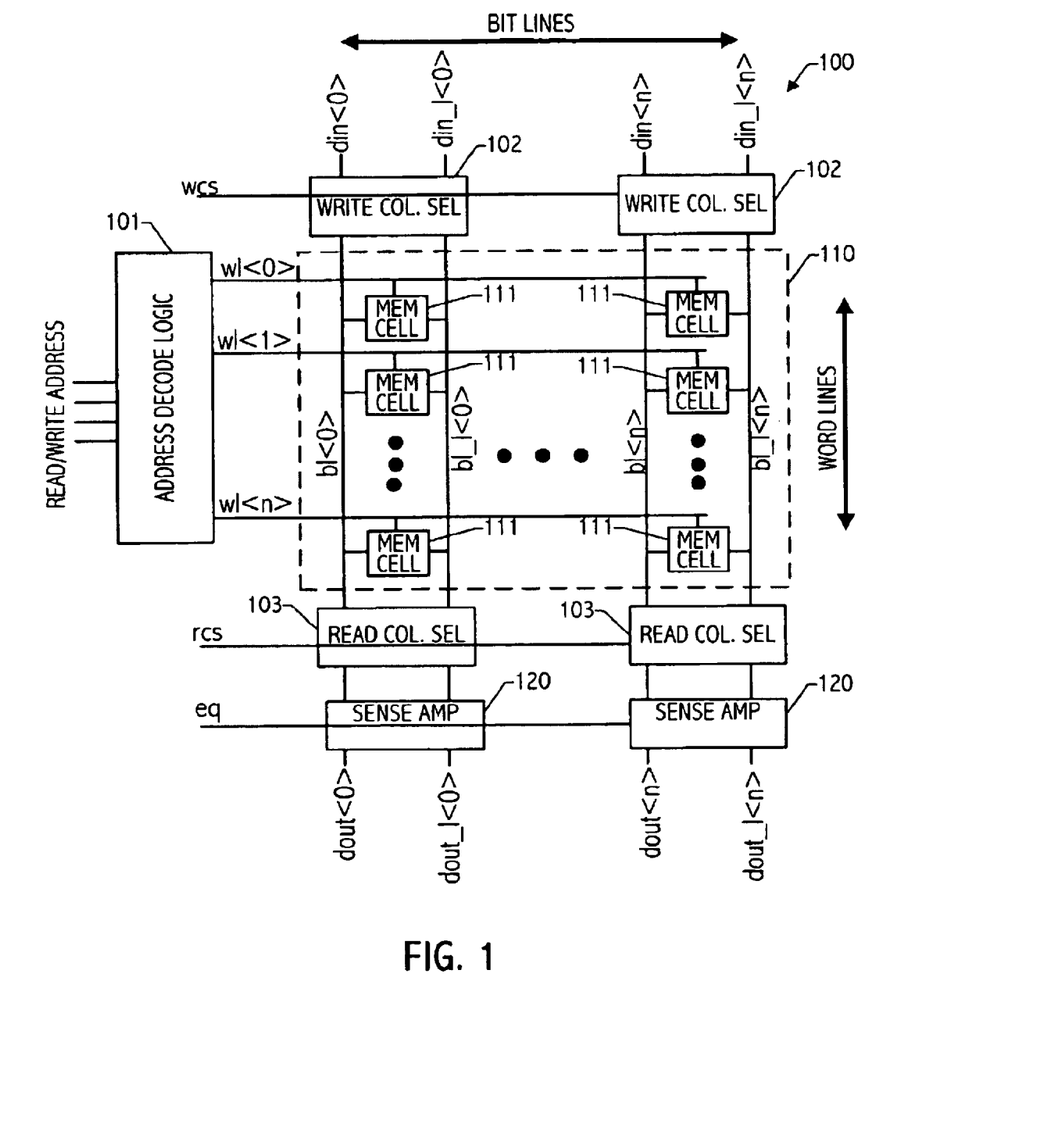
FIG. 1 depicts an illustrative memory array.

While the NBTI-related $V_t$ shift is generally monotonic, other effects need not be so and may decay over time. Similarly, disparities in device characteristics may grow or diminish based the particular bias or data histories experienced by a susceptible configuration of opposing devices. Given a particular disparate effect on opposing devices, test and variable delay compensation techniques described herein may be employed or adapted to improve memory system performance. Based on the description herein, persons of skill in the art will appreciate suitable variations on the described techniques for other susceptible circuit configurations and effects. Accordingly, in view of the foregoing, and without limitation, illustrative sense amplifier circuits susceptible to NBTI-related $V_t$ shift in opposing PMOS devices thereof and suitable test and variable delay compensation techniques are now FIG. 1 depicts an illustrative memory circuit 100, which is largely conventional in design. Address decode logic 101 and column select logic (e.g., write column select logic 102 and read column select logic 103, controllable by wcs and rcs, respectively) provide row (or word line) select addressing (e.g., by decoding READ/WRITE ADDRESS into WORD LINES wl<0>, wl<1>, ... wl<n>) and column select addressing in to an array 110 of memory cells 111. The illustration of FIG. 1 depicts multiple sense amps 120 each corresponding to a column of the array. Timing of each of the depicted sense amps is controlled, at least in part, according to a timing or strobe signal (e.g., timing signal EQ). In general, sense amps may be of any conventional design, including voltage sensing and current sensing designs, and based on the description herein, persons of skill in the art will appreciate a wide variety of suitable designs. Of course, other suitable array configurations may multiplex a given sense amp across multiple columns and/or incorporate support for other addressing models redundant row or columns, etc.

Based on FIG. 1, persons of skill in the art will appreciate that as part of a conventional memory write operation, data (e.g., received via data inputs din<0>, din<1>, . . . , din<n>, and din_l<n>) is stored in addressed ones of memory cells 111 via BIT LINES. Before the read operation, both bitlines (e.g., bl<0>, . . . , bl<n>) and their respective complements bitline_l (e.g., bl_l<0>, . . . , bl_l<n>) are precharged (e.g., to VDD). When the memory cell is read, data, e.g., a '1,' is coupled out to a bitline and compliment data, e.g., a '0,' is coupled out to a corresponding bitline_l. As a result, (in a VDD precharged configuration) the voltage on bitline_l begins to fall while the voltage on bitline remains at VDD. As part of a sensing operation, sense amplifier 120 senses and amplifies the small voltage/current difference presented on respective bit lines of the memory circuit. Under expected design conditions, dout<0> and dout_l<0> of sense amplifier 120 have logic values corresponding to the data stored in an addressed subset of memory cell 111.

Signal labels are arbitrary and will be understood as illustrative. For example, while timing signal EQ may suggest equilibration for some realizations, it should not be taken as limiting. Indeed, as used herein, timing signal EQ is representative of any of a variety of sense amp timing signals that may be employed in a particular design and for which techniques of the present invention may be employed to accommodate post-manufacture shift in device characteristics thorough selective introduction of delay.

Figure 2:
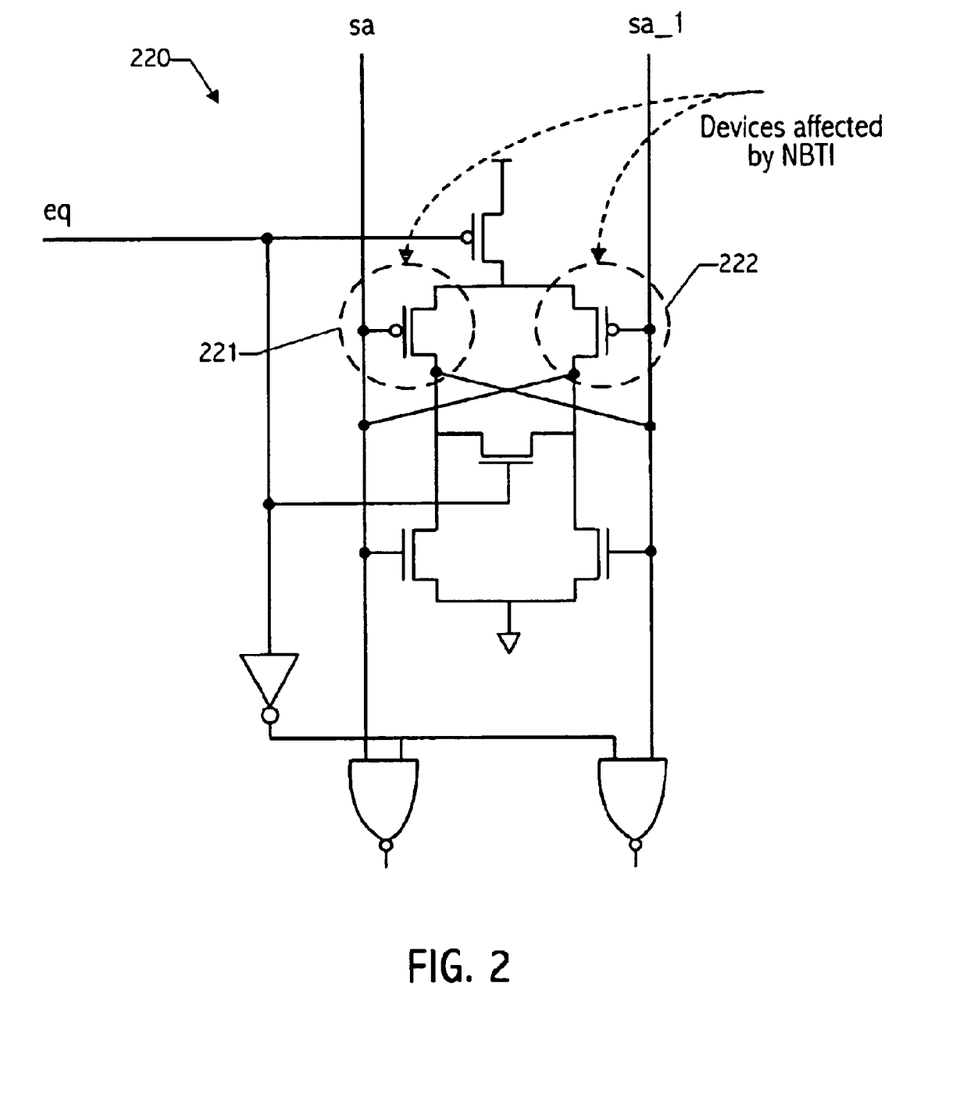
FIG. 2 depicts an illustrative sense amplifier design in which opposing PMOS devices may be affected by disparate data-dependent voltage bias histories and for which a variable delay element may at least partially compensate for a resulting device characteristic mismatch in accordance with some embodiments of the present invention.

Referring now to FIG. 2, an illustrative current sensing sense amp 220 includes opposing PMOS devices 221 and 222. As described above, optimal timing of the sense amp may be affected by data-dependent degradation or creep in device characteristics. For example, negative bias temperature instability (NBTI) effects can cause threshold voltage ($V_t$) of PMOS devices 221 and 222 to increase by an amount that depends on the historical amount of voltage bias that has been applied across gate and source/drain nodes. Given NBTI effects, a predominance of one value read out using sense amp 220 will tend to disparately affect one of the PMOS devices as compared with the opposing device. In other words, if the same data value is read over and over again using sense amp 220, then one of the two opposing PMOS devices (e.g., PMOS 221) will accumulate an NBTI-related $V_t$ shift, while the opposing PMOS device (e.g., PMOS 222) will accumulate little or no shift. The accumulated mismatch tends to cause an increase in the sense amp fail-point, i.e., the timing at which the sense amp fails to reliably read data from a corresponding memory cell. Techniques described herein allow us to detect the accumulated disparity (or at least a symptom thereof) and appropriately compensate using altered sense amp timing. In general, the magnitude of any accumulated disparity is dynamic and may shrink or grow in accordance with data readout history.

To accommodate dynamically varying accumulated disparity in the characteristics of opposing devices (e.g., to accommodate disparate NBTI-related $V_t$ shift in opposing PMOS devices 221 and 222, see FIG. 2), a variable delay mechanism is employed. In general, any of a variety of mechanisms may be employed including dynamically introducible stages of transmission gates, selectable delay lines, circuits whose timing may be altered (e.g., through selectable impedance), etc. For clarity of illustration, and without loss of generality, a transmission gate based mechanism is assumed and illustrated in FIG. 3. Nonetheless, based on the description herein, persons of skill in the art will appreciate alternatives suitable for a particular implementation.

Figure 3:
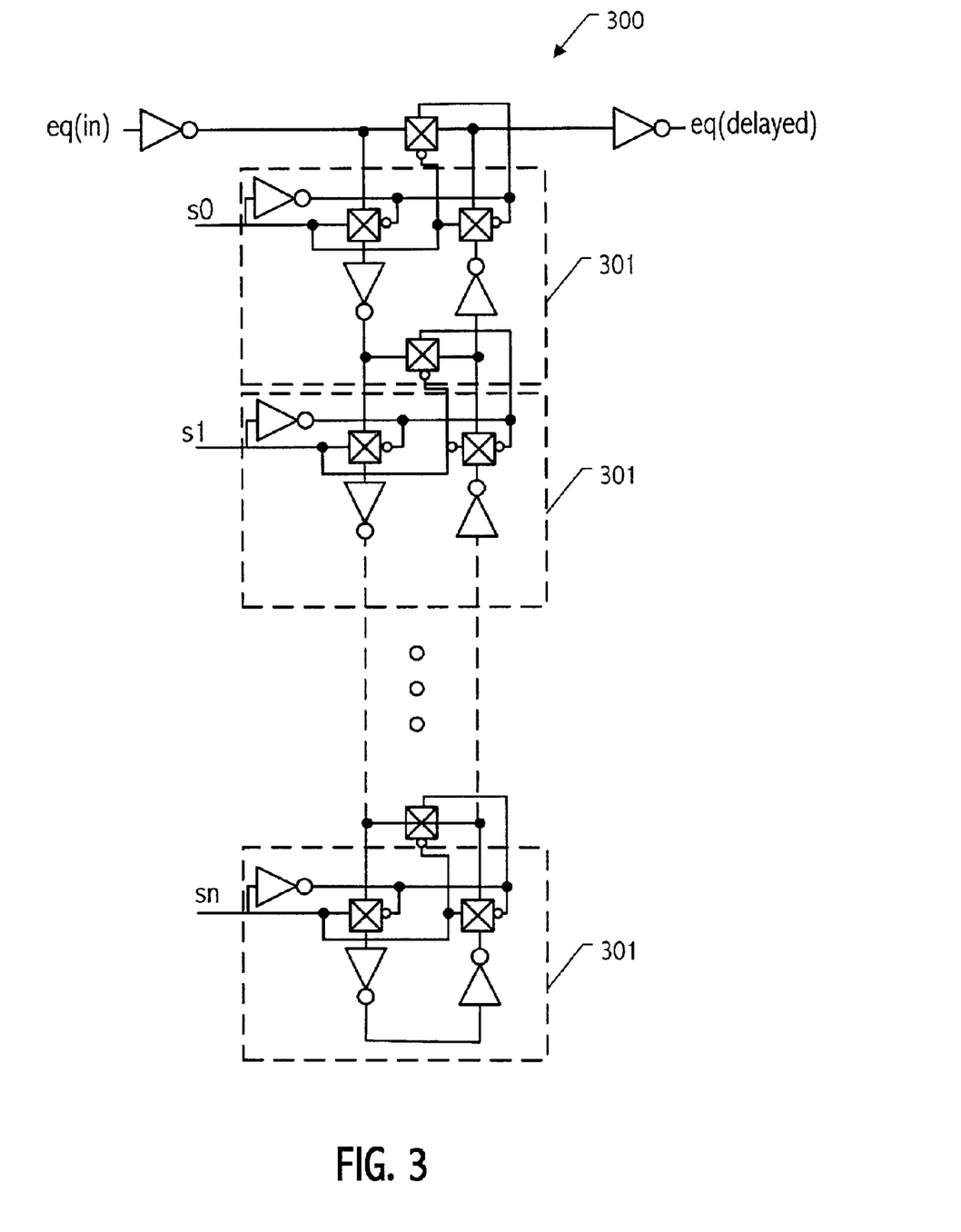
FIG. 3 depicts an illustrative delay circuit suitable for introduction, in accordance with some embodiments of the present invention, of a variable delay in a timing signal path of a circuit affected by a disparate data-dependent effect on opposing devices thereof.

FIG. 3 illustrates a variable delay circuit suitable for use in some embodiments of the present invention to introduce a variable delay in a sense amp EQ signal path. The illustrated circuit 300 includes multiple incrementally selectable delay stages 301. Although the desirable range of variation will vary from design to design, in an exemplary cache memory realization (e.g., a processor integrated circuit fabricated using a 0.15 µm MOS process), a set of 6 selectable delay stages each introducing approximately 20 ps of delay into an EQ signal path has been suitable. In general, sizing and granularity of introducible delay elements are purely a matter of design choice and any of a variety of design choices may be suitable. In some realizations, delay elements may be of non-uniform granularity.

Referring illustratively to the variable delay circuit of FIG. 3, select lines (e.g., S0, S1, . . . SN) control the delay (i.e. the delay introduced between eq(in) and eq(delayed)). For example, when all select lines are off, variable delay circuit 300 introduces a smallest delay in the EQ signal path. Turning on S0 adds delays associated with two additional inverters and two transmission gates. Additional select lines allow the addition of further delay. Using the delay circuit of FIG. 3, or any other suitable variable delay element, timing may be varied to accommodate disparate data-dependent effects (e.g., NBTI-related $V_t$ shift) on opposing devices of a sense amp. A mechanism to identify the desired delay is described next.

Figure 4:
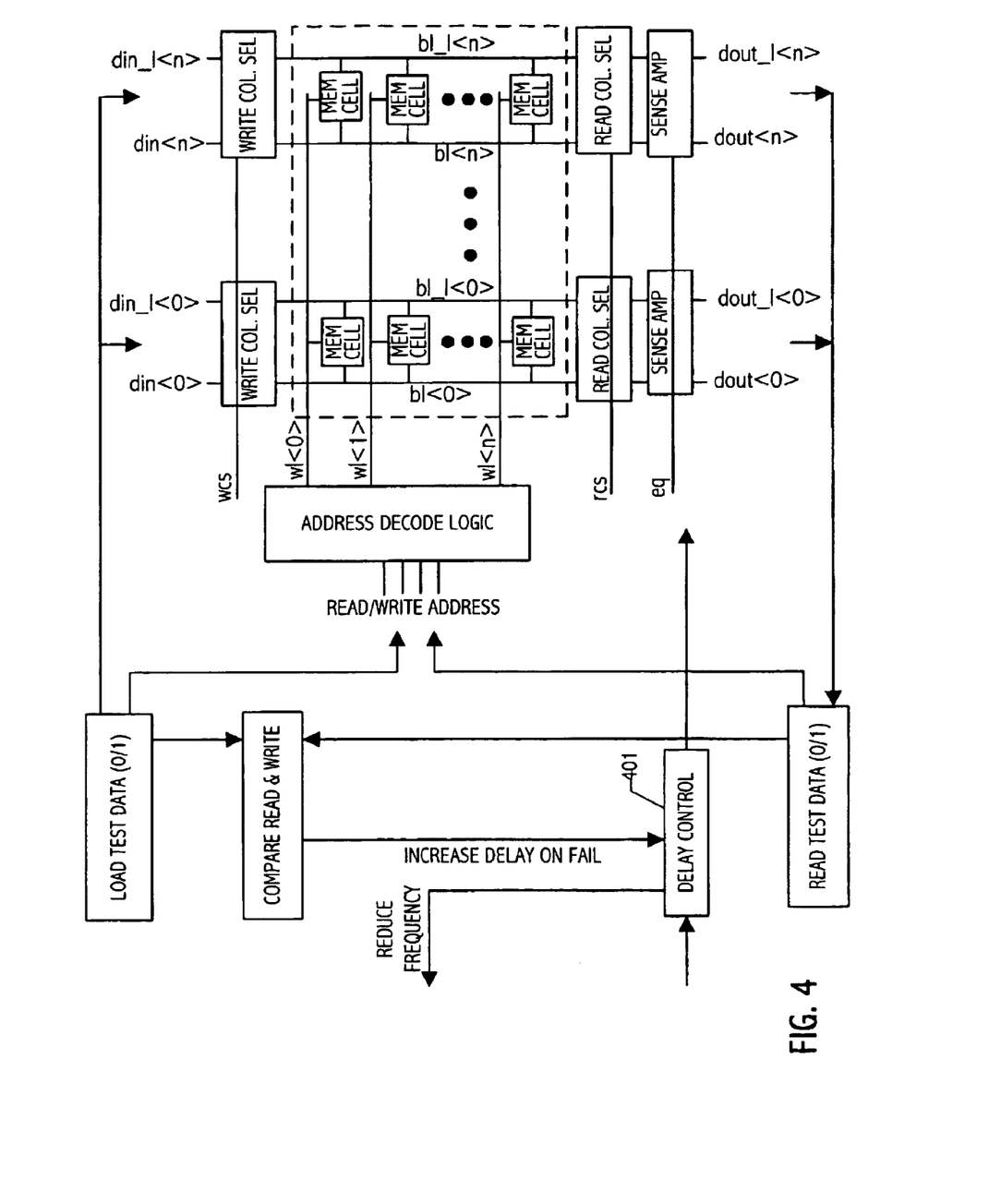
FIG. 4 illustrates data and/or control flows of an test function that may be performed in accordance with some embodiments of the present invention.

FIG. 4 illustrates data and/or control flows of a test function that may be performed in accordance with some embodiments of the present invention, in some realizations, functionality may be implemented on chip, in others, portions of the functionality may be executed under control of software (e.g., memory system or virtual memory management firmware or operating system facilities, built-in self test software or firmware, etc.), in some realizations, portions of the illustrated functionality may be implemented using circuit features while others may be supported in software. Whatever the allocation, circuits employed in a test and retime process should, themselves, be immune (or largely immune) from the compensated for degradations or characteristic shifts. For example, in a realization that compensates for disparate NBTI-related $V_t$ shifts in opposing devices of a sense amp, a test and retime circuit should not itself be susceptible to such effects. As allocation of functionality is largely a matter of design choice, the description that follows focuses on functional and/or control flows without particular regard to allocation. Based on this description, persons of ordinary skill in the art will appreciate allocations of functionality well suited to their particular implementations.

Referring to FIG. 4, a test and re-time process can be triggered to start periodically (for example, every 10,000 cycles or so) or it can be controlled by a primary signal so that software or firmware can start the process whenever memory is not busy. In general, the process includes writing test data to at least selected cells of the memory array (e.g. LOAD TEST DATA (0/1), reading from the previously written cells (e.g. READ TEST DATA (0/1), comparing the written and read data to identify discrepancies (e.g. COMPARE READ & WRITE) and varying a sense amp timing path in the event of one or more discrepancies (e.g. DELAY CONTROL 401). Depending on the realization, multiple read and/or write cycles may be employed.

Typically, a worst case set of cells will be used. For example, in a typical memory system, memory cells of a word-line or row furthest (in electrical distance) from a potentially affected sense amp will be used to test for read errors associated with potential disparate degradation or creep in opposing device characteristics. For the array and sense amp configurations and variable delay path illustrated, read out from such memory cells will generally be the most susceptible to the illustrated NBTI-related $V_t$ shifts. Of course, other selections may be desirable in other array or sense amp configurations or given another degradation or device effect to be compensated. Since the illustrated process writes and reads a row of memory, the original data in that row can either be saved temporarily until the test is done and then re-written, or the row can be marked as invalid such that contents will be re-written eventually when needed.

In some realizations, testing and retiming may be performed from a most aggressive timing (e.g., a minimal delay introduced) and increased with additional delay until successful comparisons of written and read data are repeatable, or testing and retiming may be performed from a less aggressive timing (e.g., a maximal or significant delay introduced) and decreased until unsuccessful comparisons of written and read data appear. In the latter case, back off to a successful delay setting is performed after failure. For simplicity of illustration a test-until-success approach is described although, based on the description herein, persons of ordinary skill in the art will appreciate suitable modifications for a test-until-fail variation or for a variation that employs aspects of both approaches.

Referring then to the illustration of FIG. 4, each time the process is run, the delay is reset to the smallest setting. Each sense amp using the same EQ signal will be tested (either in parallel or serially). A suitable test includes writing a zero (0) and reading it and writing a one (1) and reading it. Of course, the write/read process may be repeated a statistically-significant number of times to ensure repeatable functionality, if needed or desired. If all reads give the correct data, then the sense amp is working properly at the tested EQ delay. If any test fails, then the EQ delay is stepped up and the test is re-run. In general, failure of any sense amp that employs the same EQ signal should trigger an increase in EQ delay. Although a single test and retime EQ signal flow is illustrated, separate test and retime processes may be performed for subsets of the array (e.g., column subsets) that employ timing paths (e.g., EQ signal paths) that may be independently varied. Typically, multiple corresponding variable delay circuits are employed in such configurations.

Within at least some range of introduced delay, overall operating frequency need not be affected. However, at some level of introduced delay, it may be necessary to reduce operating frequency. Accordingly, an optional "Reduce Frequency" signal may be supported in some implementations. In such implementations, delay control 401 may supply such a signal to indicate that the delay is larger than the maximum delay consistent with current frequency. This signal can be generated by determining the cycle time resulting from each EQ delay setting and comparing that to an official production cycle time. If the selected delay increases the cycle time beyond the official production cycle time, then the "Reduce Frequency" signal is supplied.

As described above, the test can be performed in parallel by writing to a first (worst case) memory cell in each of the columns during a first cycle and then reading that data during a later cycle. In such case, an iteration includes four (4) memory access cycles (write0→read0→write1→read1) assuming no repeated testing is done at each delay setting. If a given iteration (or portion thereof) shows a failure, then EQ delay is increased and a next iteration is initialed. Assuming four (4) memory access cycles per iteration, the test and retime process will, in general, consume at a minimum of 4 cycles (best case EQ) or a maximum of 4× the number of allowed delay settings (worst case EQ). Although, a test and re-time approach based on linear addition or elimination of increments of delay is illustrated, some implementations may support variable size delay elements and/or more sophisticated search algorithms to arrive at a desired delay setting using fewer iterations. In general, given the data-dependent source of the effects compensated, testing vectors should not skew data readout history toward a particular value.

As described, the test and retime process may be performed in parallel across all columns or serially over individual columns or subsets of columns. In general, if the test is run serially, then time required for the overall process will increase proportionally. A serial test approach may reduce the amount of circuitry needed, but tends to result blocking of a representative word-line (or row) for a longer period of time. As a general matter, the desirability of a parallel or serial process is a matter of design preference.

While the invention has been described with reference to various embodiments, it will be understood that these embodiments are illustrative and that the scope of the invention is not limited to them. Many variations, modifications, additions, and improvements are possible. For example, while much of the description herein has focused on the illustrative context of NBTI-related $V_t$ shift in PMOS devices of a sense amp, techniques of the present invention may be applied to accommodate other sources of disparate degradation or shift in characteristics of opposing or complementary devices of a differential circuit. Other disparate effects, including other disparate data-dependent effects, channel hot carrier induced effects, and accumulated, persistent or decaying levels disparate effects may all be addressed using techniques of the present invention. Similarly, although cache memory of a processor integrated circuit may profitably employ or exploit techniques of the present invention (e.g., for sense amp timing) other exploitations are also suitable.

More generally, realizations in accordance with the present invention have been described in the context of particular embodiments. These embodiments are meant to be illustrative and not limiting. Accordingly, plural instances may be provided for components described herein as a single instance. Boundaries between various components, operations and circuits are somewhat arbitrary, and particular operations are illustrated in the context of specific illustrative configurations. Other allocations of functionality are envisioned and may fall within the scope of claims that follow. For example, in some realizations, aspects of array test and variable delay selection may be performed using circuit, under control of software, or using a combination of circuit and software functionality.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. Finally, structures and functionality presented as discrete components in the exemplary configurations may be implemented as a combined structure or component. These and other variations, modifications, additions, and improvements may fall within the scope of the invention as defined in the claims that follow.

What is claimed is:

1. A sensing circuit for a semiconductor memory comprising:
   transistors configured in opposition; and
   a variable delay element responsive to an accumulated data-dependent mismatch in characteristics of the opposing transistors, the variable delay element at least partially compensating for the characteristic mismatch by varying latency of a sensing operation of the sensing circuit.

2. The sensing circuit of claim 1,
   wherein the compensated for data-dependent mismatch results, at least in part, from an effect that disparately affects one of the transistors as compared with the other, the disparate effect based on a skew in a history of values read out from associated memory elements.

3. The sensing circuit of claim 2,
   wherein the disparate effect is associated with negative bias temperature instability.

4. The sensing circuit of claim 2,
   wherein the transistors are PMOS devices;
   wherein the characteristics are threshold voltage ($V_t$); and
   wherein the disparate effect involves a monotonic increase in $V_t$ based on disparate voltage bias histories of the PMOS devices.

5. The sensing circuit of claim 1,
   wherein the variable delay element is coupled into a signal path of one or more of an equalization signal and a strobe.

6. The sensing circuit of claim 1, wherein the mismatch includes:
   in a first of the opposing transistors, a first negative bias temperature instability induced shift in the characteristic; and
   in a second of the opposing transistors, a second negative bias temperature instability induced shift in the characteristic,
   wherein the characteristic mismatch is associated with an accumulated data-dependent disparity between the first and second negative bias temperature instability induced shifts.

7. The sensing circuit of claim 1,
   wherein the variable delay element is responsive to an in-situ test operation that writes data to and reads data from at least selected elements of the semiconductor memory and varies the latency to achieve identity between the written and read data.

8. The sensing circuit of claim 7,
   wherein the in-situ test operation is invoked from software.

9. The sensing circuit of claim 7,
   wherein the in-situ test operation is executed periodically.

10. The sensing circuit of claim 7,
    wherein the in-situ test operation successively increases the latency from an initial value to at least a value sufficient to achieve the identity between written and read data.

11. The sensing circuit of claim 7,
    wherein the in-situ test operation is at least partially executed by test circuit.

12. The sensing circuit of claim 7,
    wherein the selected elements of the semiconductor memory are selected for worst case signal path to the sensing circuit.

13. The sensing circuit of claim 1,
    embodied in computer readable descriptive form suitable for use in design test or fabrication of an integrated circuit.

14. A method of operating a semiconductor memory, the method comprising:
    reading from and writing to addressable locations of the semiconductor memory under control of a program executing on a processor coupled thereto; and
    performing an in-situ test operation and, responsive to failure indication consistent with an accumulated data-dependent disparity between operating characteristics of opposing devices of a sensing circuit, increasing latency of a sensing circuit control signal to accommodate the disparity.

15. A method of operating a semiconductor memory as in claim 14,
    wherein the accumulated data-dependent disparity includes negative bias temperature instability induced shifts in threshold voltage ($V_t$) based on disparate voltage bias histories of the opposing devices.

16. The method of operating a semiconductor memory as in claim 14,
    wherein the accommodated disparity results, at least in part, from an effect that disparately affects one of the opposing devices as compared with the other, the disparate effect based on a skew in a history of values read out from memory elements associated with the sensing circuit.

17. A method of operating a semiconductor memory as in claim 14, the method further comprising:
    performing, subsequent to the latency increase, additional read from and write to addressable locations of the semiconductor memory;
    performing a second in-situ test operation; and
    reducing latency of the sensing circuit control signal in accordance with a reduction in an accumulated data-dependent disparity between operating characteristics of opposing devices of a sensing circuit.

18. The sensing circuit of claim 1, further comprising:
    periodically performing in-situ test operations and adjusting the latency of the sensing circuit control signal in accordance with results thereof.

19. A method of compensating for accumulated data-dependent post-manufacture creep in a characteristic of one or more devices of a sensing circuit of a semiconductor memory, the method comprising:
    performing an in-situ test operation that writes data to and reads data from at least selected elements of the semiconductor memory; and
    varying latency in a control signal path leading to the sensing circuit to achieve identity between the written and read data, the latency variation at least partially compensating for the characteristic mismatch.

20. A method as in claim 19,
    wherein the devices include PMOS devices configured in opposition; and
    wherein the characteristic is threshold voltage ($V_t$) of the PMOS devices.

21. A method as in claim 19,
wherein the post-manufacture creep results from disparate voltage bias histories experienced by the devices.
22. A method as in claim 19,
wherein post-manufacture creep results from negative bias temperature instability induced shifts in threshold voltage ($V_t$) of the devices.
23. A method as in claim 19,
wherein the devices are configured in opposition; and
wherein the post-manufacture creep disparately affects one of the opposing devices as compared with the other, the disparate effect based on a skew in a history of values read out from memory elements associated with the sensing circuit.
24. An integrated circuit comprising:
a sensing circuit susceptible to an accumulated data-dependent post-manufacture creep in a characteristic of a device thereof, the characteristic creep affecting optimal timing of the sensing circuit; and
a variable delay element introducible in a timing path coupled to the sensing circuit, the variable delay element responsive to an operating symptom of the characteristic creep.
25. The integrated circuit of claim 24, further comprising:
a test circuit, the variable delay element responsive to the test circuit.
26. The integrated circuit of claim 24,
wherein the operating symptom includes a read after write failure.
27. The integrated circuit of claim 24,
wherein the integrated circuit includes a differential bit-line pair and the differential circuit includes a sense amplifier coupled thereto.
28. The integrated circuit of claim 24,
wherein the data-dependent post-manufacture creep is associated, at least in part, with a negative bias temperature instability (NBTI) effect.
29. The integrated circuit of claim 24,
wherein the device is a PMOS device and the characteristic includes threshold voltage thereof.
30. The integrated circuit of claim 24,
wherein the timing path affects delivery of a strobe signal to the differential circuit.
31. The integrated circuit of claim 24,
wherein the timing path affects delivery of an equalization signal to the differential circuit.
32. The integrated circuit of claim 23,
embodied in computer readable descriptive form suitable for use in design, test or fabrication of the integrated circuit.
33. The integrated circuit of claim 24,
wherein the variable delay element includes a selectable set of transmission gates.
34. An integrated circuit chip that compensates for disparate accumulated data-dependent post-manufacture creep in a characteristic of opposing devices of a sense amplifier at least in part by varying a latency of a sense amplifier control signal.
35. The integrated circuit chip of claim 34,
wherein the opposing devices are PMOS devices; and
wherein the characteristic is a threshold voltage ($V_t$) of the PMOS devices.
36. The integrated circuit chip of claim 34,
wherein the data-dependent post-manufacture creep is associated, at least in part, with a negative bias temperature instability (NBTI) effect.
37. The integrated circuit chip of claim 34, further comprising:
a test circuit that compares data written to and read from at least selected memory elements; and
a variable delay element responsive to the test circuit for adjusting the latency to achieve identity between the written and read data.
38. The integrated circuit chip of claim 34,
embodied as a semiconductor memory.
39. The integrated circuit chip of claim 34,
embodied as a processor integrated circuit including memory or cache.
40. A computer readable encoding of a semiconductor integrated circuit design, the computer readable encoding comprising:
one or more media encoding a representation of a memory circuit that includes plural pairs of bit lines, memory cells coupled to respective ones of the bit line pairs, and sense amplifiers coupled to one or more respective ones of the bit line pairs;
the one or more media further encoding a representation of at least one variable delay circuit coupled into a control signal path of one or more respective ones of the sense amplifiers, the variable delay circuit responsive to a signal indicative of an accumulated data-dependent mismatch in characteristics of the opposing devices of at least one of the respective sense amplifiers to at least partially compensate for the characteristic mismatch by varying latency of a sensing operation of the sense amplifier.
41. The computer readable encoding of claim 40,
wherein each of the one or more media are selected from the set of a disk, tape or other magnetic, optical, semiconductor or electronic storage medium and a network, wireline, wireless or other communications medium.
42. The computer readable encoding of claim 40, in combination with one or more respective media readers therefor, wherein the one or more media and respective media readers, when combined, are exercisable to supply an information stream suitable to at least partially define one or more process steps for fabrication of semiconductor integrated circuits in accordance with the encoded design.
43. An apparatus comprising:
means for sensing a differential signal in a semiconductor memory;
means for varying delay of a sensing operation of the sensing means, the variable delay means responsive to an accumulated data-dependent mismatch in characteristics of opposing devices of the sensing means, wherein the variable delay means, when employed, at least partially compensates for the characteristic mismatch.

* * * * *

UNITED STATES PATENT AND TRADEMARK OFFICE
CERTIFICATE OF CORRECTION

PATENT NO. : 6,762,961 B2
DATED : July 13, 2004
INVENTOR(S) : Eleyan et al.

It is certified that error appears in the above-identified patent and that said Letters Patent is hereby corrected as shown below:

Column 3,
Lines 28-29, "compensates for the characteristic" should read -- compensates for the characteristic mismatch. --.
Line 60, "the characteristic" should read -- the characteristic mismatch. --.

Column 4,
Line 53, "techniques are now" should read -- techniques are now described --.

Signed and Sealed this

Eighteenth Day of January, 2005

JON W. DUDAS
*Director of the United States Patent and Trademark Office*